United States Patent

Fukui et al.

[11] Patent Number: 6,028,542
[45] Date of Patent: Feb. 22, 2000

[54] DIGITAL SIGNAL PROCESSING APPARATUS

[75] Inventors: Takao Fukui; Kazutoshi Nomoto; Michimasa Sekiguchi, all of Kanagawa, Japan

[73] Assignee: Sony Corporation, Tokyo, Japan

[21] Appl. No.: 08/553,092

[22] Filed: Nov. 3, 1995

[30] Foreign Application Priority Data

Nov. 4, 1994 [JP] Japan .................................. 6-271175

[51] Int. Cl.[7] .................................................. H03M 7/00
[52] U.S. Cl. ................................................. 341/123
[58] Field of Search ...................... 341/123, 61; 364/725; 375/122

[56] References Cited

U.S. PATENT DOCUMENTS 5,495,432  2/1996  Ho ............................................ 364/725

*Primary Examiner*—Brian K. Young
*Attorney, Agent, or Firm*—Frommer Lawrence & Haug, LLP.; William S. Frommer

[57] ABSTRACT

A digital signal processing apparatus for matching the sampling frequency of an input digital signal to an internal sampling frequency. The digital signal processing apparatus has a sampling frequency converting unit for matching the sampling frequency of an input digital signal to an internal sampling frequency, a sampling frequency detection unit for detecting the sampling frequency of the input digital signa, a frequency difference calculating unit for finding the frequency difference between the inherent sampling frequency of the input digital signal and the sampling frequency detected by the sampling frequency detection unit and a pitch shifting unit for shifting the pitch of an output digital signal of the sampling frequency converting unit based upon said frequency difference. If the input digital signal has the sampling frequency slightly offset from the inherent sampling frequency, the signal of the inherent sampling frequency can be recovered, while the pitch can be restored to the inherent pitch.

8 Claims, 8 Drawing Sheets

FADE-IN , FADE-OUT

CROSS-FADE

DECODING

SIGNAL

CROSS-FADE

DIGITAL SIGNAL PROCESSING APPARATUS

BACKGROUND OF THE INVENTION

This invention relates to a digital signal processing device for matching the sampling frequency of an input digital signal to an internal sampling frequency.

If, in a digital signal processing device in which signal processing is performed on digital signals having a pre-set sampling frequency, a signal is entered which has been processed with a sampling frequency different from the pre-set sampling frequency employed in the device, there is typically no alternative but to convert the sampling frequency with the aid of a sampling rate converter in order to admit the input signals into the device.

The constitution of a sampling rate converter for of converting the sampling frequency is schematically shown in FIG. 1. It is assumed that the signal sampled at the sampling frequency $FS_{44.1}$ of 44.1 kHz, as in the case of a compact disc (CD), is to be recorded on a tape using a digital tape recorder (DAT) having the sampling frequency $FS_{48}$ of 48 kHz. That is, since the playback signal from the CD is the signal with the sampling frequency $FS_{44.1}$ with which the signal is recorded on the disc, the sampling frequency $FS_{44.1}$ of the playback signal from the disc needs to be converted into the sampling frequency $FS_{48}$ for DAT if the signal is to be recorded on the DAT.

Referring to FIG. 1, an input signal reproduced from the CD, with the sampling frequency $FS_{44.1}$ is supplied to an input terminal 100 and thence to a sampling rate converter 101. The sampling rate converter is fed via a terminal 103 with an internal frequency signal corresponding to the sampling frequency $FS_{48}$ of the DAT. The sampling rate converter 101 over-samples the input signal with the sampling frequency $FS_{44.1}$ and interpolates necessary data by data interpolation. The resulting signal is down-sampled based upon the internal frequency signal for conversion to the signal with the sampling frequency $FS_{48}$. This down-sampled frequency-converted signal is fed via a terminal 102 to the DAT.

By this sampling frequency conversion, the reproduced signal from the CD, recorded on the tape by DAT, retains the inherent pitch (interval) with which the signal was recorded on the CD.

Meanwhile, if it is assumed that the tape running speed on the DAT slightly deviates from a pre-set speed, as when the tape is run at a slightly higher or lower rate, the data transfer rate is also slightly deviates from the pre-set rate. If the output signal from the DAT is supplied to an external equipment, such as another DAT, the external equipment determines that the sampling frequency has deviated.

If the sampling frequency is matched using the sampling rate converter, the interval of the resulting signal deviated from the pitch with which the signal was inherently recorded on the DAT. This is tantamount to slightly faster or slower rotation of an analog tape recorder.

As an illustrative example, a commercial music piece which should be 30 seconds long becomes 31 seconds long on recording, and the tape so recorded is run (rotates) at a slightly faster speed for reproducing the music piece within 30 seconds.

If an external equipment operating with the inherent sampling frequency with which the music piece was recorded should receive the signal reproduced at the slightly faster speed, such external equipment converts the sampling frequency using the above-mentioned sampling rate converter in order to admit the music piece. In this case, since the signal recorded in 31 seconds is reproduced in 30 seconds, the pitch (interval) is higher than the inherent pitch.

OBJECT AND SUMMARY OF THE INVENTION

It is therefore an object of the present invention to provide a digital signal processing device which on reception of an input signal of a sampling frequency slightly deviated from the inherent sampling frequency is capable not only of restoring the sampling frequency to the inherent frequency but also of restoring the pitch to the original pitch.

According to the present invention, there is provided a digital signal processing device having sampling frequency converting means for matching the sampling frequency of an input digital signal to an internal sampling frequency, sampling frequency detection means for detecting the sampling frequency of the input digital signal, frequency difference calculating means for finding the frequency difference between the inherent sampling frequency of the input digital signal and the sampling frequency detected by the sampling frequency detection means, and pitch shifting means for shifting the pitch of an output digital signal of the sampling frequency converting means based upon the frequency difference.

If the inherent sampling frequency of the input digital signal and the sampling frequency of the actual input digital signal, which should inherently be equal to each other, are different from each other, the pitch of the input digital signal is deviated from the inherent pitch. According to the present invention, the sampling frequency of the input digital signal is matched to the internal sampling frequency, while the pitch of the input digital signal is shifted based upon the frequency difference between the inherent sampling frequency and the actual sampling frequency. Thus, even if the input digital signal having the sampling frequency slightly deviated from the inherent digital signal is received, such input digital signal can be restored to the signal of the inherent sampling signal, while the pitch may also be restored to the inherent pitch.

BRIEF DESCRIPTION OF THE DRAWINGS

FIG. 9 illustrates the waveform after fade-out and fade-in.

DETAILED DESCRIPTION OF THE PREFERRED EMBODIMENT

Figure 1:
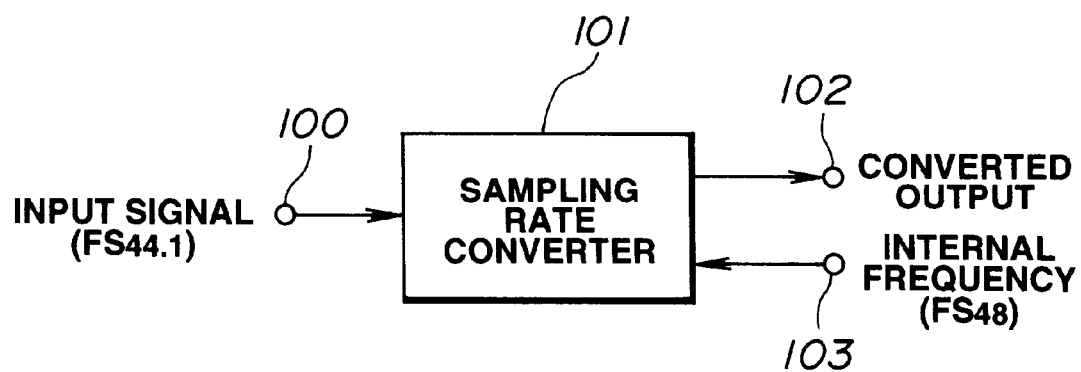
FIG. 1 is a block circuit diagram for illustrating the operation of a conventional sampling rate converter.

Referring to the drawings, an illustrative embodiment of the present invention will be explained in detail.

Figure 2:
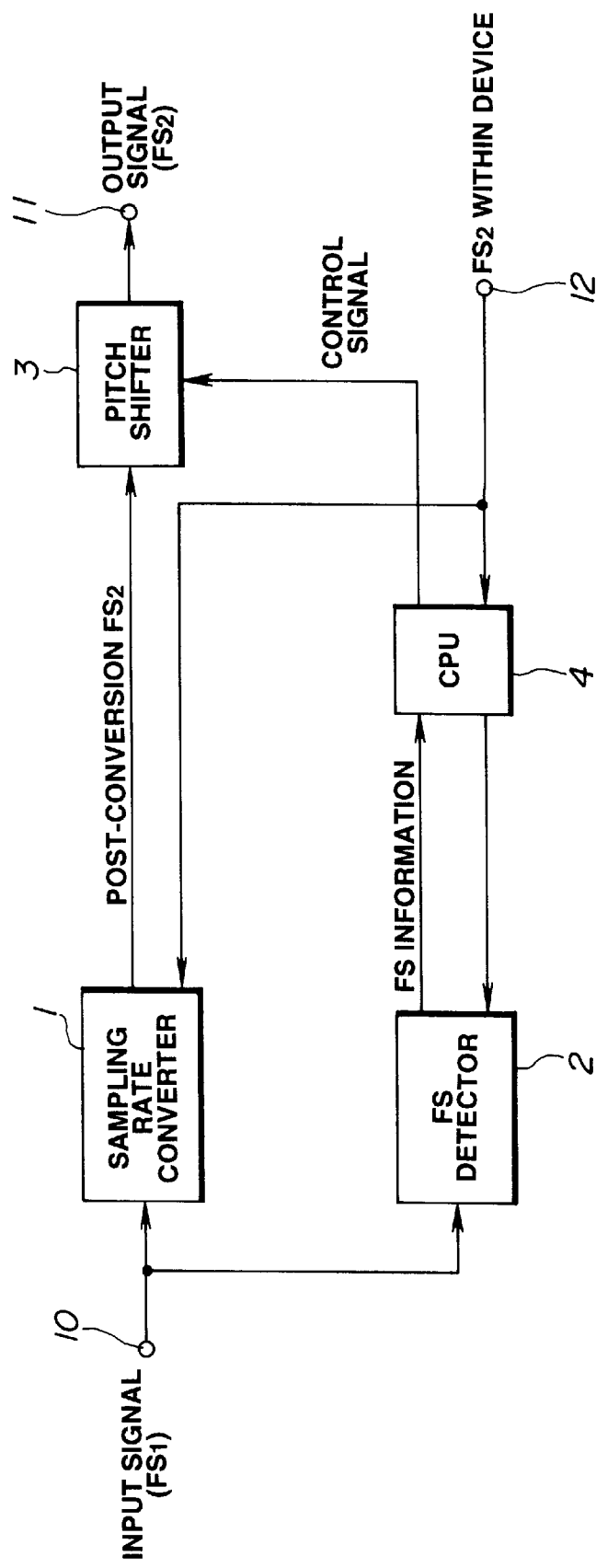
FIG. 2 is a block circuit diagram showing the construction of essential portions of a digital signal processing device embodying the present invention.

FIG. 2 shows the construction of essential portions of the digital signal processing device of the present invention.

Referring to FIG. 2, the digital signal processing device includes a sampling rate converter 1 for matching a sampling frequency $FS_1$ to an internal sampling frequency $FS_2$, a sampling frequency detector 2 for detecting the sampling frequency $FS_1$ of the input digital signal, a CPU 4 for finding the frequency difference between the inherent sampling frequency $FS_2$ of the input digital signal and the sampling frequency $FS_1$ detected by the sampling frequency detector 2, and a pitch shifter 3 for shifting the pitch of the output digital signal of the sampling rate converter 1 based upon a control signal corresponding to the frequency difference as found by the CPU 4.

The digital signal processing device of the instant embodiment is fed with digital signals reproduced from e.g., a digital audio tape recorder (DAT), and performs the operation of matching the sampling frequency of the signal supplied to the input terminal 10 to the inherent sampling frequency with which the signal was recorded on a magnetic tape if the sampling frequency of the signal supplied to the input terminal 10 differs from the inherent sampling frequency.

Referring to FIG. 2, digital audio data at a transfer rate which slightly deviates from the inherent pre-set rate is supplied as an input signal by a previous stage DAT being run (rotating) at a slightly faster or slower rate. That is, digital audio data equivalent to data sampled at the sampling frequency $FS_1$, which slightly deviates from the inherent sampling frequency $FS_2$ used during recording are supplied to the input terminal 10.

The input signal of the sampling frequency $FS_1$ is fed to the sampling rate converter 1. The converter 1 converts the sampling frequency $FS_1$ into the sampling frequency $FS_2$ within the digital signal processing device, that is a frequency equal to the inherent sampling frequency supplied via a terminal 12. The converted signal from the sampling rate converter 1 is supplied to a pitch shifter 3 which will be hereinbelow explained.

The conversion operation by the sampling rate converter 1 will be explained in connection with numerical figures. In this example it is assumed that the inherent sampling frequency at a previous stage DAT, generating digital audio signals supplied to the input terminal 10, is 48 kHz, and the sampling frequency of a succeeding stage DAT, that is the sampling frequency in the interior of the digital signal processing device, is also 48 kHz. If, if the operation of reproducing a music piece inherently 31 seconds long within 30 seconds or less is performed, as described above, the input signal supplied to the input terminal 10 is equivalent to a signal having the sampling frequency of 48×(31/30) kHz (=49.6 kHz). That is, the input digital audio signal is a signal higher in pitch by 31/30 (=1.03333 . . . ), that is about 3%, than the original recorded signal. The sampling rate converter 1 converts the input digital audio signal, higher in pitch by about 3%, into a signal of the inherent sampling frequency of 48 kHz. However, since only the sampling frequency is converted, the pitch remains higher than 31/30.

According, the digital signal processing device has the following construction and operation.

Figure 3:
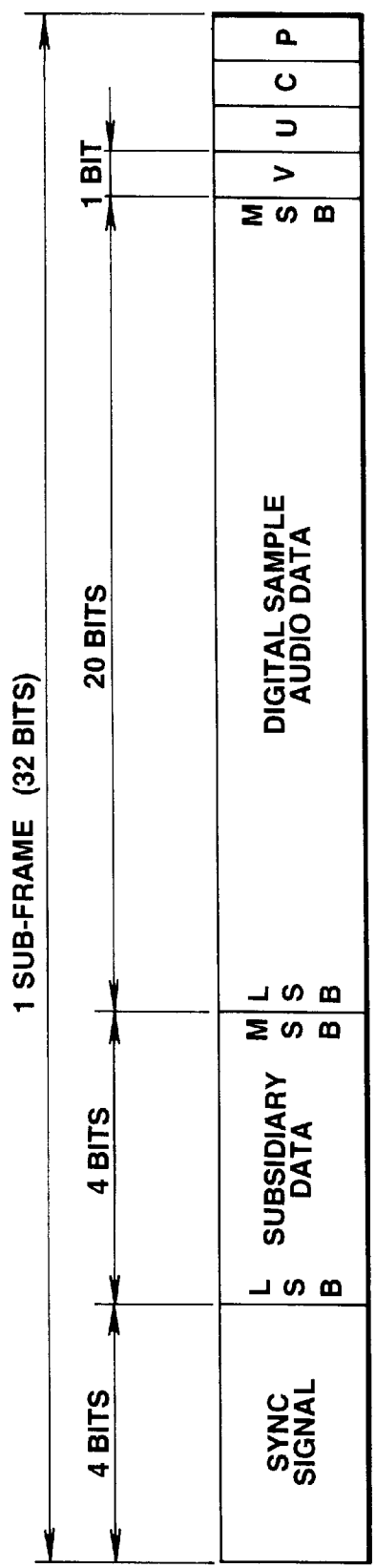
FIG. 3 illustrates the format of an input signal.

The input signal entering the input terminal 10 is fed both to the sampling rate converter 1 and to the sampling frequency detector 2. In the present embodiment, a format of the AES (Audio Engineering Society)/EBU (European Broadcasting Union) standard is employed as the format for the input digital audio signal. The format of a sub-frame of the digital audio sample data is shown in FIG. 3, in which each sub-frame or sample is made of 32 bits, namely 4 bits of synchronization signals or preamble, 4 bits of subsidiary data, 20 bits of digital audio sample data, and 1 bit each of audio sample parity (V), user bit data (U), audio channel status (C) and sub-frame parity (P). Preferably, one hundred ninety-two (192) of the sub-frames or samples make up one block. The sampling frequency detector 2, supplied with the above-described format of the input digital audio signal, extracts the sampling frequency information contained in the 4-bit subsidiary data of the above format, that is the SF information indicating the inherent sampling frequency of the input signal, under control of the CPU 4. The SF information, that is the information specifying the inherent frequency 48 kHz, and the frequency information of the current input signal, that is the information specifying the frequency $FS_1$ of 49.6 kHz, are routed to the CPU 4.

The CPU 4 is fed with the signal of the internal sampling frequency $FS_2$ (48 kHz) within the digital signal processing device, and calculates, from the sampling frequency in the device equivalent to the inherent sampling frequency and the sampling frequency of the current input signal of the FS information from the frequency detector 2, the ratio of the frequency of the current input signal (48 kHz) to the inherent frequency 49.6 kHz (49/48.6=48/48×(31/30)=31/30), that is the pitch deviation caused in the signal converted by the sampling rate converter 1, and routes a control signal corresponding to the results of calculation to the pitch shifter 3.

The pitch shifter 3 shifts the pitch of the pitch-deviated signal supplied from the sampling rate converter 1, under control by the sampling rate converter 1. That is, the control signal is a signal indicating how much pitch change restores the pitch to an original pitch value. By the pitch shifter 3 performing the pitch-shifting based upon the control signal, the pitch of the signal outputted from the pitch shifter 3 is restored to the original pitch value. This output signal is fed from the terminal 11 to a circuit constituting the major portion of the DAT.

The various components shown in FIG. 2 will be explained in detail.

Figure 4:
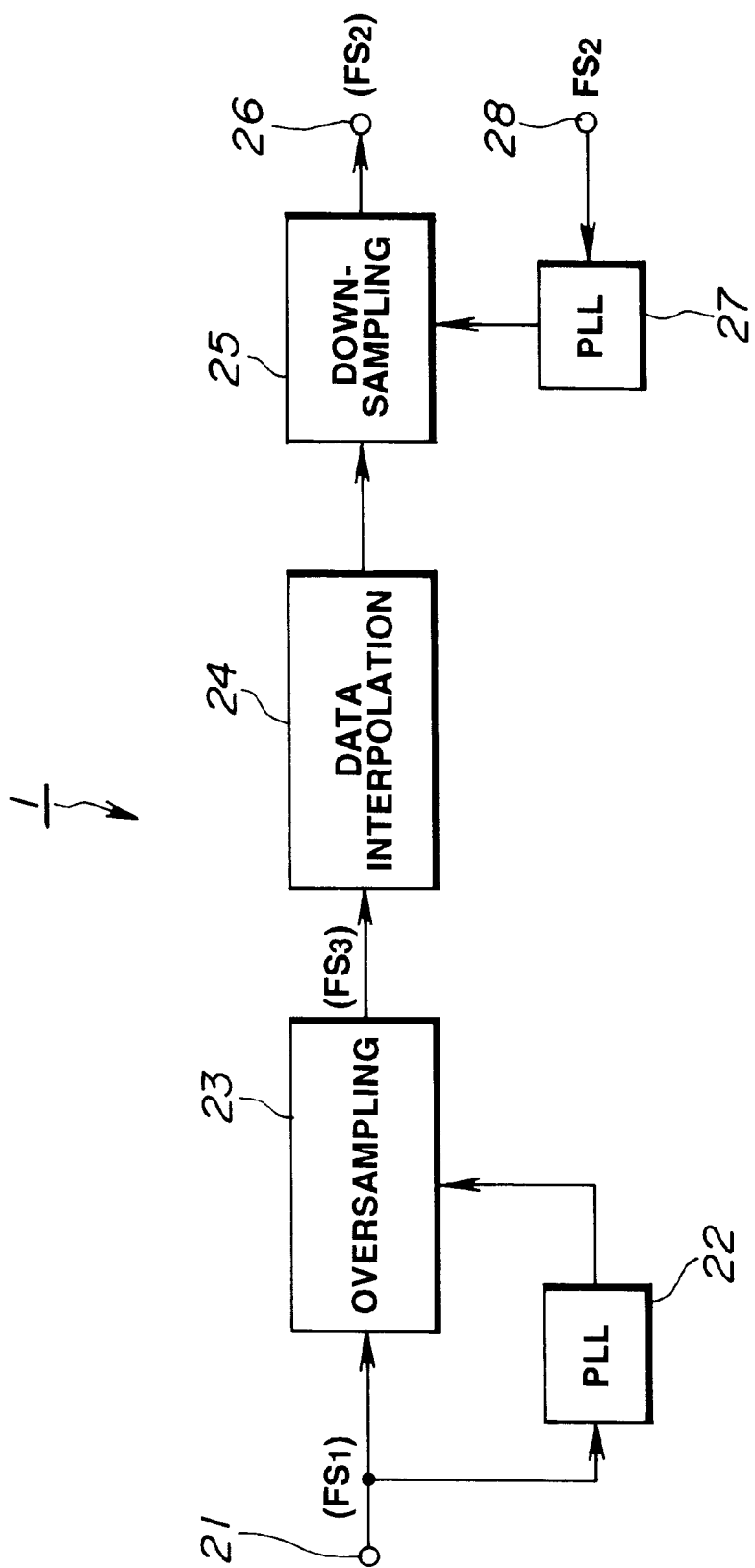
FIG. 4 is a block circuit diagram showing an illustrative construction of a sampling rate converter of the device shown in FIG. 1.

Specifically, the sampling rate converter 1 is configured as shown for example in FIG. 4.

Referring to FIG. 4, the signal from an input terminal 10 of FIG. 2 is supplied to the input terminal 21 and thence to an over-sampling circuit 23 and to a phase-locked loop circuit (PLL) 22. The PLL circuit 22 forms clocks from the input signal, while the over-sampling circuit 23 over-samples the input signal with e.g., a sampling frequency $FS_3$. An output signal of the over-sampling circuit 23 is routed to a data interpolation circuit 24 for data interpolation, such as linear data interpolation, before being fed to a down-sampling circuit 25. The internal sampling frequency $FS_2$ (the sampling frequency within the device) shown in FIG. 2 is fed to a terminal 28. The clocks generated from this signal by the PLL circuit 27 are also fed to the down-sampling circuit 25. The down-sampling circuit 25 down-samples the data-interpolated signal to the sampling frequency $FS_2$ based upon clocks from the PLL circuit 27. The down-sampled signal is fed via a terminal 26 to the pitch shifter 3 of FIG. 2.

Figure 5:
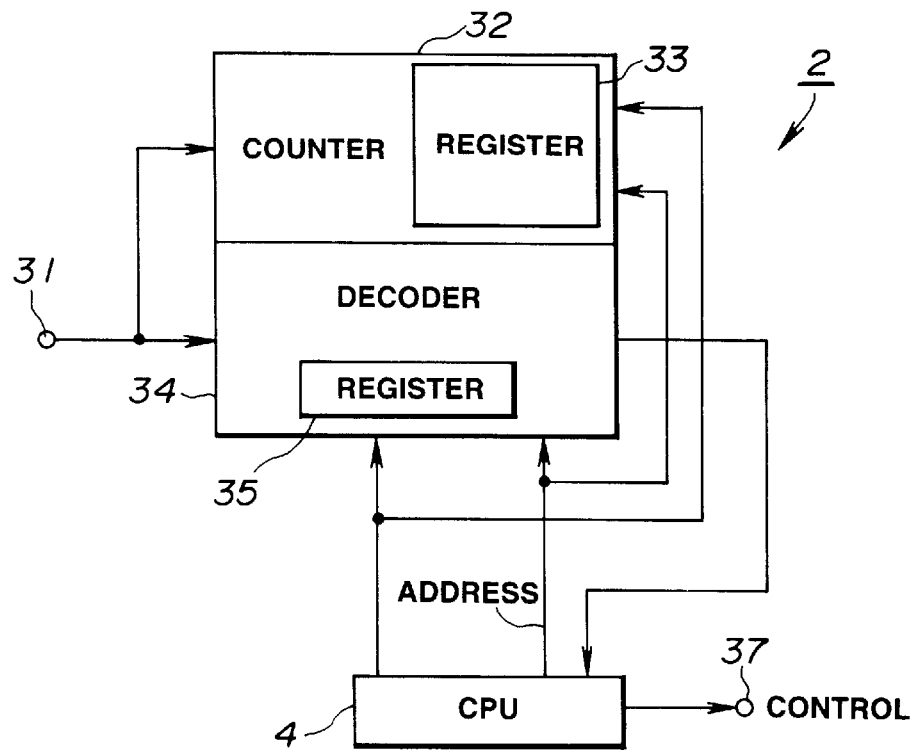
FIG. 5 is a block circuit diagram showing an illustrative construction of a sampling frequency detector and a CPU of the device shown in FIG. 1.

The sampling frequency detector 2 and the CPU 4 shown in FIG. 2 are specifically configured as shown for example in FIG. 5.

In FIG. 5, input signals of the format of FIG.3 are supplied to an input terminal 31 from the input terminal 10 of FIG.

2. This input signal is fed to a decoder 34 and to a counter 32. The counter 32 counts the sub-format of FIG. 3, based upon the control data and the address from the CPU 4, a pre-set number of times (preferably 192 times) for storage in a register 33. The decoder 34 extracts the subsidiary data of the format of FIG. 3, based upon the control data and the address from the CPU 4 and upon the count value of the counter 32 for storage in the register 35. The auxiliary data is fed to the CPU 4, which then finds the inherent sampling frequency from the subsidiary data, while also finding the frequency information of the current input signal, for accordingly forming the above control signal. This control signal is fed to the pitch shifter 3 via a terminal 37.

Figure 6:
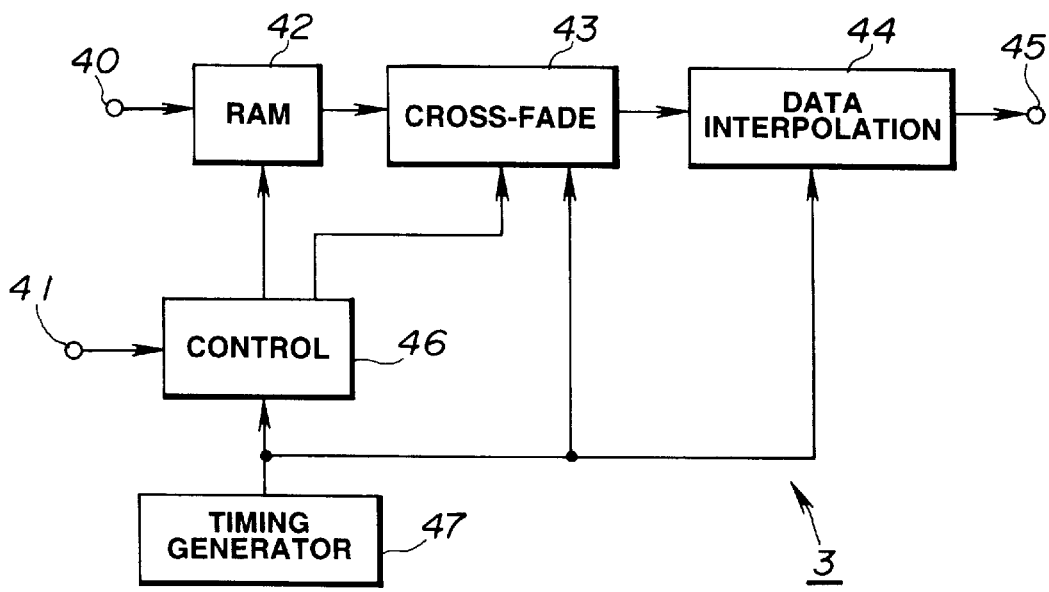
FIG. 6 is a block circuit diagram showing an illustrative construction of a pitch shifter of the device shown in FIG.1.

Specifically, the pitch shifter 3 of FIG. 2 is configured as shown for example in FIG. 6.

In FIG. 6, the signal from the sampling converter 1 is fed to a terminal 40 and thence to a RAM (random access memory) 42. A control circuit 46 routes a write address and a readout address to the RAM 42, based upon a timing signal from the timing generator 47. The write address permits data to be written in the RAM 42 every sampling period of the signal from the terminal 40, while the readout address permits data in the RAM 42 to be read out as the readout address is moved relative to the write address. That is, the storage space of the RAM 42 is controlled as to write/readout in a ring fashion.

The control signal from the CPU 4 is fed to the terminal 41 and thence to the control circuit 46. The control circuit 46 reads out data at temporally displaced position for pitch shift from the RAM 42 based upon the control signal. The data read out from the RAM 42 is fed to a cross-fading circuit 43 which is similarly controlled by the control circuit 46 and which is actuated by the timing signal from the timing generator.

The cross-fading circuit 43 cross-fades the temporally displaced data read out from the RAM 42 for pitch shifting. The distance (time difference) between two cross-faded data has a proper range for the acoustic sense of the human being, that is, if the distance is too short or too long, the feeling of modulation due to the cross-fade period become strong, or the time difference between the two data becomes audible, respectively, thus leading to double sounds from the percussion instrument or wobbled tempo. In this consideration, the above distance is set to a proper value which is heard more spontaneously by the listener.

The basic operation of the pitch shifter 3 is to decrement the base address of the RAM 42 on the sample basis. The input signal is written in a physical address write area which is decremented by -1 from sample to sample. Thus, the positive relative value of read address relative to the write address corresponds to the delay time of the read data with respect to the write data. The gradient of the relative addresses between two read addresses represents pitch data which is added to the relative address from sample to sample. The relative address has a bit length which satisfies the pitch precision as a real number value. The upper and lower order bits, for example, represent the relative address and values for data interpolation, respectively.

The function of the pitch shifter itself has been adopted in C×D 2907Q which is an IC produced by the present Assignee.

If the pitch data is represented by a real-number address, the pitch ratio rp is given by rp=1.0−pitch data whereas, if it is represented by a cent-value, where a semitone is 100 cent, the pitch ratio is given by Pitch ratio$_{[cent]}$=1200 log$_2$(rp)=1200 (log(1.0−pitch data)/log(2)

Since the sub-decimal point address is composed of e.g., 12 bits, the pitch resolution becomes 1200 log$_2$(0.5+2$^{-12}$/0.5)≈0.845[cent]

in the case that the sound is lower by one octave, thus satisfying the design criteria.

From the required pitch ratio, pitch data is represented by the following equation:

pitch data=1−2$^{Pitch\ Ratio/1200}$

The cross-fading functional value in the cross-fading circuit 43 is generated from the above relative address. Since two signals co-exist by cross-fading, outputs cancel or intensify each other. If the two signals exhibit no correlation, the functional value is found by a mean square value.

An output of the cross-fading circuit 43 is routed to a data interpolation circuit 44 operating at the timing of the timing generator 47. The data interpolating circuit 44 effects the simplest first-order linear interpolation. The real value at an optional point between discrete sampling points is obtained by filtering designed for completely suppressing the frequency not less than the sampling frequency/2, more precisely, one-half of the equivalent re-sampling frequency. Since the quality of the pitch shifter 3 is influenced more significantly by the cross-fading function and two-data time difference and also the variation in spectra distribution caused by pitch conversion acts on the acoustic sense, the above-mentioned first-order linear interpolation is employed. An output of the data interpolation circuit 44 is routed to an output terminal 11 of FIG. 2 via an output terminal 45.

For facilitating the understanding of the operation of the pitch shifter and cross-fading, the following qualitative description is useful. The following will explain the raising of the pitch of the source sound having the waveform shown in FIG. 7, corresponding to rapid talking. For simplicity, reference is made only to domain A and the next domain B. It should, however, be noted that the same holds for domains B, C and for domains C, D as well. For raising the pitch by e.g., 25% in each of the domains A and B, the cross-fading period (t) as shown in FIG. 8 is presupposed. Thus, t=T× 25/100.

Figure 9:
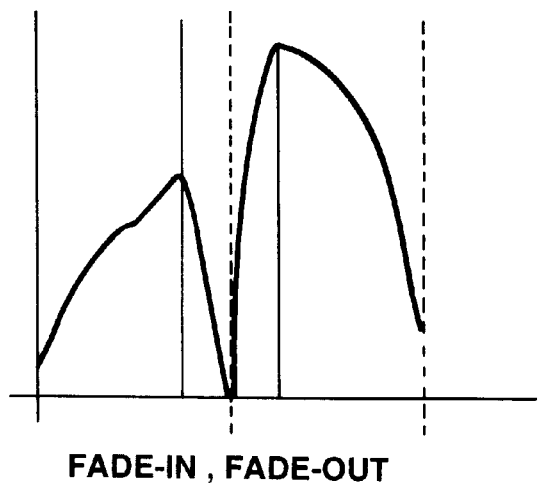
Figure 10:
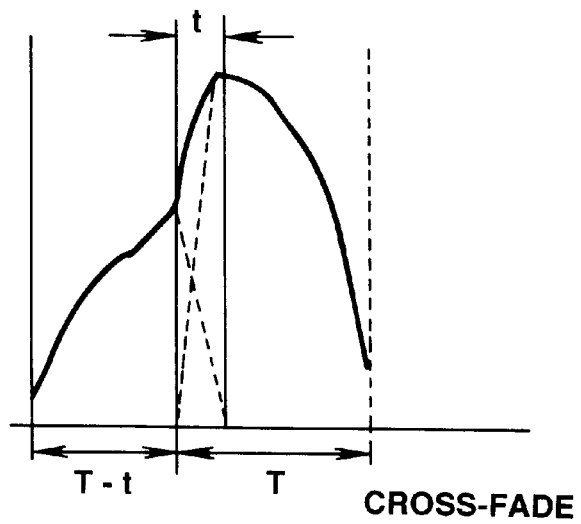
FIG. 10 illustrates the waveform of a signal produced by cross-fading.

Then, in each of the cross-fading periods, fade-out and fade-in operations are performed in the domains A and B, respectively. By these operations, signals of the respective domains A and B are as shown in FIG. 9. The starting points of the fade-in and fade-out are then coincided, whereby the faded-in and faded-out signals connect to each other smoothly, as shown in FIG. 10. Thus the pitch for the domain A is raised by 25%. The above operations are performed as described above for the domains B–C and for the domains C–D and so forth until ultimately the pitch is raised by 25%.

Figure 7:
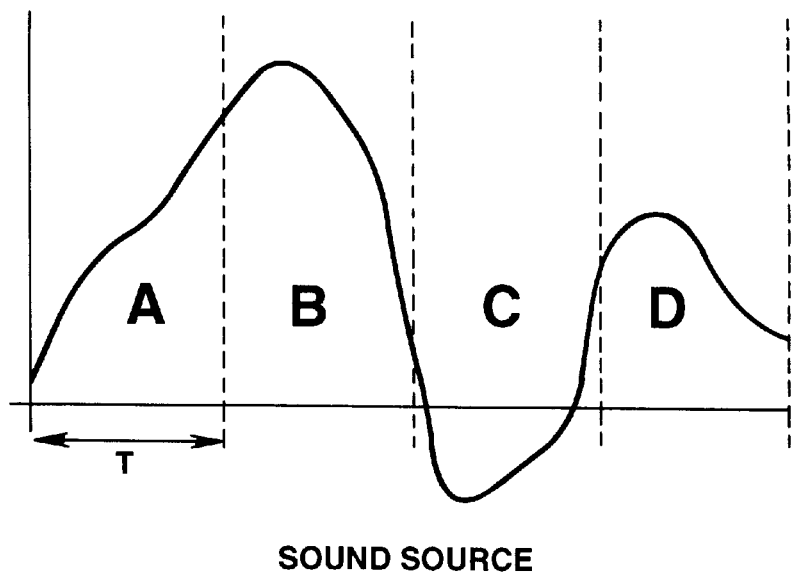
FIG. 7 illustrates the waveform of an original sound.
Figure 8:
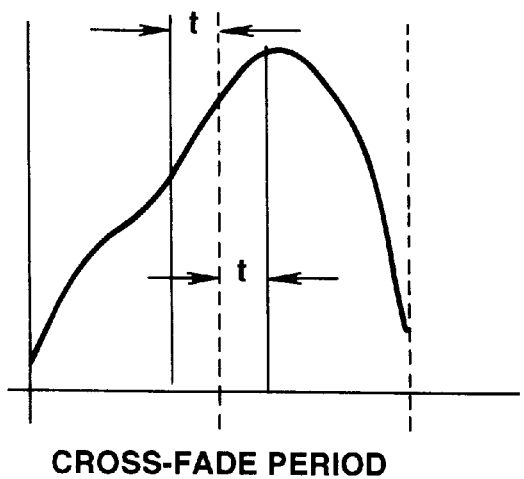
FIG. 8 illustrates the cross-fading period.
Figure 11:
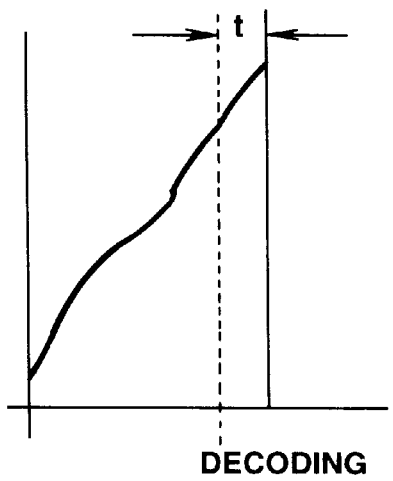
FIGS. 11 and 12 show cross-fade periods.
Figure 12:
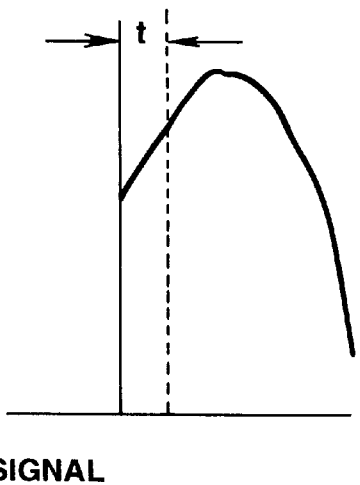
Figure 13:
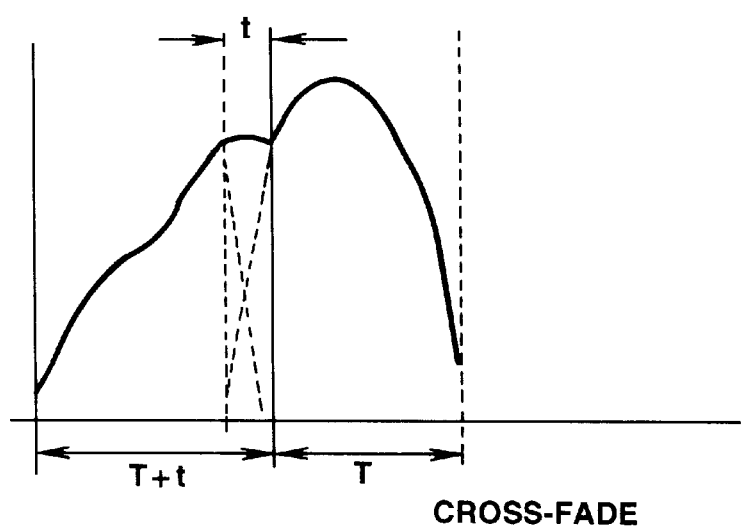
FIG. 13 shows a signal waveform of a signal produced by cross-fading.

Next the lowering the pitch of the source sound having the waveform shown in FIG. 7, corresponding to slow talking, is explained. First, the cross-fading period (t) is presupposed, as shown in FIGS. 11 and 12. In this case, a signal corresponding to the domain A summed to the cross-fading period of the domain B (FIG. 11) and a signal corresponding to the domain B summed to the cross-fading period of the domain A (FIG. 12) are considered. If the signals shown in FIGS. 11 and 12 are cross-faded as in the case of raising the pitch, the signal as shown in FIG. 13 is obtained, with the pitch being lowered by 25%. That is, the length of the domain A is longer by 25% than T.

What is claimed is:

1. A digital signal frequency converting apparatus comprising:

sampling frequency converting means for converting a sampling frequency of an input digital signal to an internal sampling frequency and for producing a converted signal;

sampling frequency detection means for detecting said sampling frequency of said input digital signal;

frequency difference calculating means for calculating a frequency difference between an inherent sampling frequency of said input digital signal and the sampling frequency detected by said sampling frequency detection means; and pitch shifting means for shifting a pitch of said converted signal as a function of said frequency difference.

2. A digital signal processing apparatus comprising:

sampling frequency converting means for matching the sampling frequency of an input digital signal to an internal sampling frequency;

sampling frequency detection means for detecting the sampling frequency of the input digital signal;

frequency difference calculating means for finding the frequency difference between the inherent sampling frequency of the input digital signal and the sampling frequency detected by said sampling frequency detection means; and pitch shifting means for shifting the pitch of an output digital signal of said sampling frequency converting means based upon said frequency difference wherein said pitch shifting means includes a cross-fading circuit.

3. A sampling frequency converting apparatus for converting a digital signal converted from an audio signal sampled at a pre-set frequency into said pre-set frequency, said digital signal corresponding to said pre-set frequency, said digital signal sampled at said pre-set frequency having been recorded along with the subsidiary data representing said pre-set frequency on a recording medium at a pre-set recording velocity and having been reproduced at a velocity different from said recording velocity, with the reproduced digital signal having a sampling frequency different from the sampling frequency corresponding to said pre-set frequency, comprising:

means for receiving the reproduced digital signal having the sampling frequency different from said pre-set frequency;

sampling rate converting means for converting the reproduced digital signal from said receiving means having the sampling frequency different from said pre-set frequency into a digital signal having the sampling frequency corresponding to said pre-set frequency;

means for detecting a frequency difference between said pre-set frequency represented by said subsidiary data and the sampling frequency of said digital signal different from said pre-set frequency;

pitch shifting means supplied with an output signal of said sampling rate converting means; and means for controlling the shifting quantity of said pitch shifting means responsive to an output signal of said frequency difference detection means.

4. The digital signal processing apparatus as claimed in claim 3 wherein said sampling rate converting means includes at least an over-sampling circuit, a data interpolation circuit and a down-sampling circuit.

5. Apparatus according to claim 1, wherein said sampling frequency converting means comprises:

oversampling means for oversampling said input digital signal to produce an oversampled signal;

interpolating means for interpolating said oversampled signal to produce an interpolated signal; and downsampling means for downsampling said interpolated signal to produce said converted signal.

6. Apparatus according to claim 1, wherein said sampling frequency detection means comprises extracting means for extracting said inherent sampling frequency from said input digital signal and for supplying an information signal representative of said inherent sampling frequency to said frequency difference calculating means.

7. Apparatus according to claim 1, wherein said frequency difference calculating means comprises means for generating a control signal representative of said frequency difference and for supplying said control signal to said pitch shifting means.

8. Apparatus according to claim 1, wherein said pitch shifting means comprises:

Memory means for storing said converted signal;

cross-fading means for retrieving said converted signal from said memory means and for cross-fading said converted signal to produce a cross-faded signal; and interpolating means for interpolating said cross-faded signal to produce a pitch-shifted signal.

* * * * *